(12) United States Patent
Welch et al.

(10) Patent No.: US 8,848,301 B2
(45) Date of Patent: Sep. 30, 2014

(54) FOCUS COMPENSATION FOR OPTICAL ELEMENTS AND APPLICATIONS THEREOF

(75) Inventors: William Hudson Welch, Charlotte, NC (US); David Ovrutsky, Charlotte, NC (US); Andrew Aranda, Matthews, NC (US)

(73) Assignee: FLIR Systems Trading Belgium BVBA, Meer (BE)

( * ) Notice: Subject to any disclaimer, the term of this patent is extended or adjusted under 35 U.S.C. 154(b) by 76 days.

(21) Appl. No.: 13/144,655

(22) PCT Filed: Feb. 3, 2010

(86) PCT No.: PCT/US2010/022971
§ 371 (c)(1),
(2), (4) Date: Sep. 1, 2011

(87) PCT Pub. No.: WO2011/049635
PCT Pub. Date: Apr. 28, 2011

(65) Prior Publication Data
US 2011/0304930 A1    Dec. 15, 2011

Related U.S. Application Data

(60) Provisional application No. 61/253,337, filed on Oct. 20, 2009.

(51) Int. Cl.
*G02B 7/02* (2006.01)
*G02B 9/08* (2006.01)
*G02B 9/00* (2006.01)
*H01L 27/146* (2006.01)
*H04N 5/225* (2006.01)

(52) U.S. Cl.
CPC .... *H01L 27/14625* (2013.01); *H01L 27/14618* (2013.01); *H01L 27/14632* (2013.01); *H01L 27/14685* (2013.01); *H04N 5/2257* (2013.01)
USPC ..................... 359/819; 359/739; 359/796

(58) Field of Classification Search
USPC .................. 359/739, 796, 811, 819
See application file for complete search history.

(56) References Cited

U.S. PATENT DOCUMENTS

| | | |
|---|---|---|
| 6,836,612 B2 | 12/2004 | Morris et al. |
| 6,931,181 B2 | 8/2005 | Jewell et al. |
| 6,934,460 B2 | 8/2005 | Morris et al. |
| 2005/0077458 A1 | 4/2005 | Ma et al. |
| 2005/0275750 A1 | 12/2005 | Akram et al. |
| 2007/0070511 A1 | 3/2007 | Lee et al. |
| 2007/0166029 A1 | 7/2007 | Lee et al. |
| 2008/0007623 A1 | 1/2008 | Lee et al. |
| 2008/0122055 A1 | 5/2008 | Perkins |

FOREIGN PATENT DOCUMENTS

EP    1389804 A2    2/2004

OTHER PUBLICATIONS

PCT/US2010/022971 EP Search Report with mailing date of Aug. 19, 2010.
PCT/US2010/022971 EP Written Opinion with mailing date of Sep. 19, 2010.
U.S. Appl. No. 12/908,747, filed Oct. 20, 2010, Ovrutsky et al.

*Primary Examiner* — William Choi
(74) *Attorney, Agent, or Firm* — Kilpatrick Townsend & Stockton LLP

(57) ABSTRACT

Optical imaging apparatus are provided having the desired focal properties, which can be manufactured and/or assembled at the wafer level.

28 Claims, 14 Drawing Sheets

FOCUS COMPENSATION FOR OPTICAL ELEMENTS AND APPLICATIONS THEREOF

RELATED APPLICATION DATA

This application is a national stage application that claims priority under 35 USC §§365 and 371 to PCT/US2010/022971 filed Feb. 3, 2010, which claims priority pursuant to 35 U.S.C. §119(e) to U.S. Provisional Patent Application Ser. No. 61/253,337, filed on Oct. 20, 2009 which are hereby incorporated by reference in their entireties.

FIELD OF THE INVENTION

The present invention relates to optical elements and, in particular, to optical elements used in optical imaging apparatus.

BACKGROUND OF THE INVENTION

Optical imaging apparatus incorporating solid state sensing elements find application in a variety of fields ranging from military reconnaissance and surveillance to consumer electronics. Solid state cameras, for example, are used in a number of consumer electronics including cell phones, digital still cameras, computers, toys and automotive driver aids. In order to satisfy demand, solid state cameras are required to be manufactured in significant quantities ordering on the millions per day. In view of these numbers, efficient and low cost manufacture of solid state cameras and other optical apparatus is of high importance.

Traditionally, solid state camera modules are manufactured as discrete units. Optical elements of a module, for example, are separately mounted in a lens turret. A housing is subsequently attached to the camera substrate, and the lens turret is inserted into the housing by means of a screw thread to position the optical elements over an image sensor. The height of the optical elements of each module is adjusted to achieve the best focus by rotation of the lens turret in the housing.

A disadvantage of the foregoing manufacturing technique is that the focus adjustment for the optical element of each module is effectively administered serially. Manufacturing solid state camera modules and other optical apparatus in a serial format can significantly increase costs and time of manufacture. Such inefficiencies are only magnified when producing high volumes of camera modules.

SUMMARY

In view of the foregoing disadvantages, the present invention provides optical imaging apparatus having the desired focal properties, which can be manufactured and/or assembled at the wafer level. Wafer level assembly, in some embodiments, can offer cost and time efficient production of optical imaging apparatus while avoiding one or more inefficiencies associated with serial manufacturing techniques.

In one embodiment, an optical imaging apparatus comprises at least one wafer level optical element, a spacer coupled to the wafer level optical element and a plurality of focus compensation standoffs on the spacer, the standoffs defining an electro-optical element or wafer level optical element mounting surface having a surface roughness different from at least one other surface roughness of the spacer. In some embodiments, the plurality of standoffs are bonded to the spacer. In some embodiments, the plurality of standoffs are continuous with the spacer or form a monolithic structure with the spacer.

An optical imaging apparatus, in some embodiments, further comprises an electro-optical element. In some embodiments, an electro-optical element is a photodetector or sensing element. In some embodiments, an electro-optical element is an electromagnetic radiation emitting element, such as a light emitting diode. The electro-optical element, in some embodiments, is coupled to the mounting surfaces of the plurality of standoffs.

A focus compensation standoff, according to embodiments described herein, has dimensions suitable for setting the wafer level optical element(s) at the desired distance or height from an image plane such as to set the focal point of the optical element(s) at or near the image plane. In some embodiments, an image plane of an optical imaging apparatus coincides with the plane of the electro-optical element.

As optical imaging apparatus described herein, in some embodiments, can be constructed at the wafer level, the present invention also provides a spacer wafer comprising a first aperture and a plurality of first focus compensation standoffs corresponding to a first optical element location on an optical wafer and a second aperture and a plurality of second focus compensation standoffs corresponding to a second optical element location on the optical wafer. In some embodiments, the height of the plurality of first focus compensation standoffs is different from the height of the second focus compensation standoffs. In other embodiments, the height of the plurality of first focus compensation standoffs is the same or substantially the same as the height of the plurality of second focus compensation standoffs.

In another aspect, the present invention provides a wafer assembly comprising an optical wafer and a second wafer coupled to the optical wafer, the optical wafer comprising an array of optical elements. A first optical die is located at a first die location on the wafer assembly and comprises a first optical element on the optical wafer and a first focus compensation standoff on the second wafer. A second optical die is located at a second die location on the wafer assembly and comprises a second optical element on the optical wafer and a second focus compensation standoff on the second wafer, wherein the height of the second focus compensation standoff is different from the height of the first focus compensation standoff.

In some embodiments, the second wafer is coupled to the optical wafer at the first die location by the first focus compensation standoff and at the second die location by the second focus compensation standoff. In some embodiments, the first focus compensation standoff and the second focus compensation standoff are not coupled to the optical wafer and have mounting surfaces for receiving an electro-optical element, a third wafer or a second optical wafer.

Moreover, in another aspect, the present invention also provides a wafer comprising a plurality of singulated wafer level optical die assemblies. In one embodiment, a wafer comprises a first singulated optical die assembly comprising a first optical element, a first spacer and a first focus compensation standoff and a second singulated optical die assembly comprising a second optical element, a second spacer and a second focus compensation standoff. In some embodiments, the first and second focus compensation standoffs have unequal heights.

In another aspect, the present invention provides methods of producing optical imaging apparatus. As described further herein, methods of the present invention, in some embodiments, can overcome one or more inefficiencies of prior optical element focusing techniques wherein focal adjustments are made after assembly of the optical element into a turret or barrel.

In one embodiment, a method of producing an optical imaging apparatus comprises providing at least one wafer level optical element, determining the focal length of the wafer level optical element, coupling a spacer to the optical element, providing a plurality of standoffs on the spacer, calculating the focus compensation for the optical element relative to an image plane and adjusting the height of the standoffs to provide the focal point of the wafer level optical element at or near the image plane. In some embodiments, the image plane is chosen according to the application or desired properties of the optical imaging apparatus.

In some embodiments, a method of producing an optical imaging apparatus further comprises coupling an electro-optical element to mounting surfaces of the standoffs. In some embodiments, a surface of the electro-optical element coincides with the image plane of the wafer level optical element.

In another embodiment, a method of producing an optical imaging apparatus comprises providing at least one wafer level optical element, determining the focal length of the wafer level optical element, providing a spacer, providing a plurality of standoffs on the spacer, calculating the focus compensation for the optical element relative to an image plane, adjusting the height of the standoffs to provide the focal point of the wafer level optical element at or near the image plane and coupling wafer level optical element to mounting surfaces of the standoffs. In some embodiments, a method of producing an optical imaging apparatus further comprises coupling an electro-optical element to the spacer.

In another embodiment, a method of producing a plurality of optical imaging apparatus comprises providing at least one optical wafer comprising a first optical element at a first die location and a second optical element at a second die location on the optical wafer and determining the focal length of the first optical element and the focal length of the second optical element. A spacer wafer is coupled to the optical wafer and a plurality of first standoffs is provided on the spacer wafer at the first die location to provide a first optical die. A plurality of second standoffs is provided on the spacer wafer at the second die location to provide a second optical die. The focus compensation of the first optical element relative to a first image plane is calculated. The focus compensation of the second optical element relative to a second image plane is calculated. The height of the plurality of first standoffs is adjusted to provide the focal point of the first optical element at or near the first image plane, and the height of the plurality of second standoffs is adjusted to provide the focal point of the second optical element at or near the second image plane. In some embodiments, the first standoffs and the second standoffs are adjusted to different heights.

Moreover, in some embodiments, a method of producing a plurality of optical imaging apparatus further comprises singulating the first optical die and the second optical die. Once the first and second optical dies have been singulated, a first electro-optical element, in some embodiments, is coupled to mounting surfaces of the first standoffs to provide a first optical imaging apparatus. Additionally, in some embodiments, a second electro-optical element is coupled to mounting surfaces of the second standoffs to provide a second optical imaging apparatus.

In other embodiments, the first singulated optical die and the second singulated optical die are coupled to a wafer. The wafer can subsequently be coupled to an electro-optical element wafer comprising a first electro-optical element and a second electro-optical element. Coupling the wafer to the electro-optical element wafer, in some embodiments, achieves the desired alignment between the first singulated optical die and the first electro-optical element as well as between the second singulated optical die and the second electro-optical element. Additionally, in some embodiments, the first image plane coincides with a surface of the first electro-optical element, and the second image plane coincides with a surface of the second electro-optical element.

The wafer and the first and second electro-optical elements can be singulated to provide a singulated first optical imaging apparatus and a singulated second optical imaging apparatus.

These and other embodiments are described in greater detail in the detailed description which follows.

DETAILED DESCRIPTION

The present invention can be understood more readily by reference to the following detailed description, examples and drawings and their previous and following descriptions. Elements, apparatus and methods of the present invention, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

The present invention provides optical imaging apparatus having the desired focal properties, which can be manufactured and/or assembled at the wafer level. Wafer level assembly, in some embodiments, can offer cost and time efficient production of optical imaging apparatus while avoiding one or more inefficiencies associated with serial manufacturing and/or focusing techniques.

Figure 1:
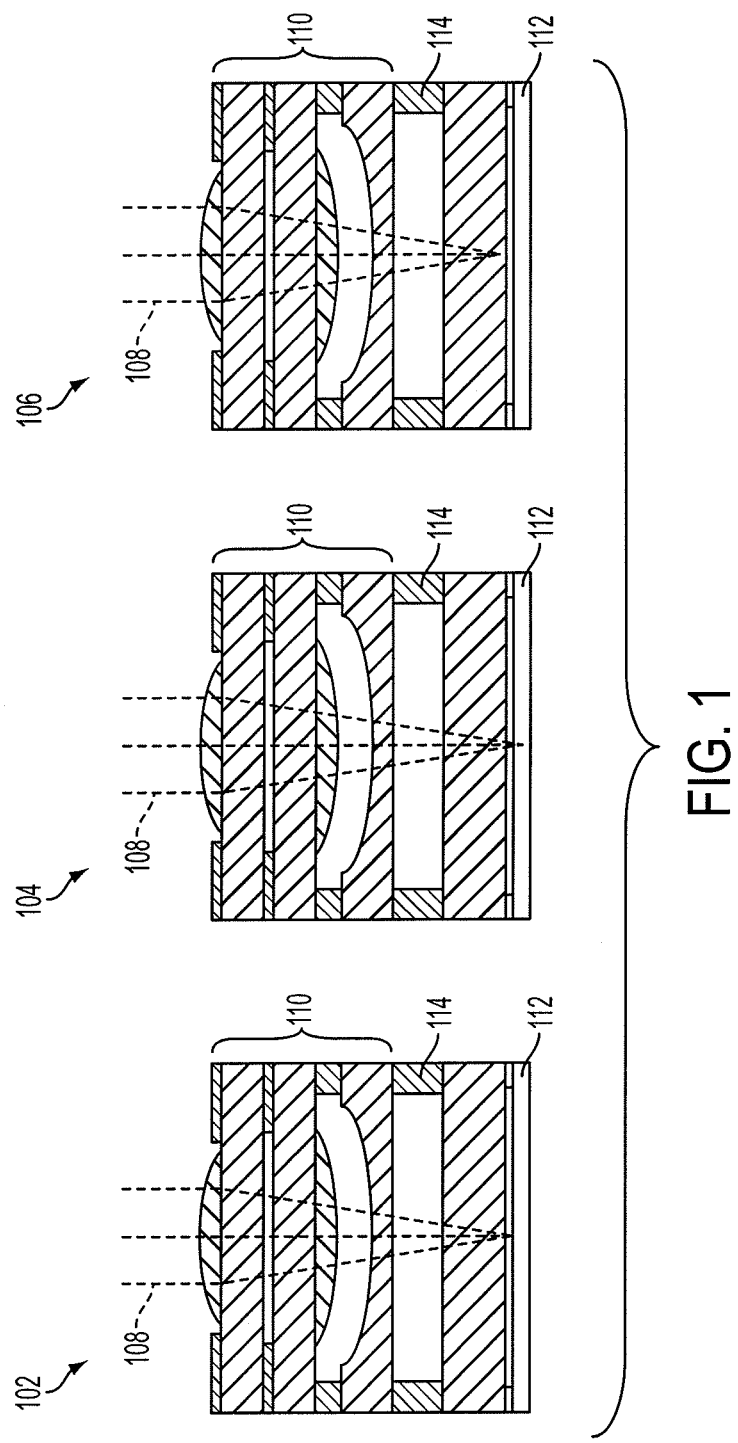
FIG. 1 illustrates optical imaging apparatus characterized by varying focal lengths.

Manufacturing variations within a single wafer as well as between batches of wafers can result divergent focal positions of optical imaging apparatus constructed from the wafers. FIG. 1 illustrates three optical imaging apparatus (102, 104, 106) constructed from common lens stack wafers and an electro-optical element wafer. For each optical imaging apparatus, focal position is illustrated by an exemplary beam of light (108) focused by the optical element stack (110) towards the image sensor (112). As provided in FIG. 1, the optical element stack (110) of optical imaging apparatus (104) focuses an image below the surface of the image sensor (112) while the optical element stack (110) of optical imaging apparatus (106) focuses an image above image sensor (112). Moreover, the optical element stack (110) of the optical imaging apparatus (102) focuses the image at or near the surface of the image sensor (112).

Figure 2:
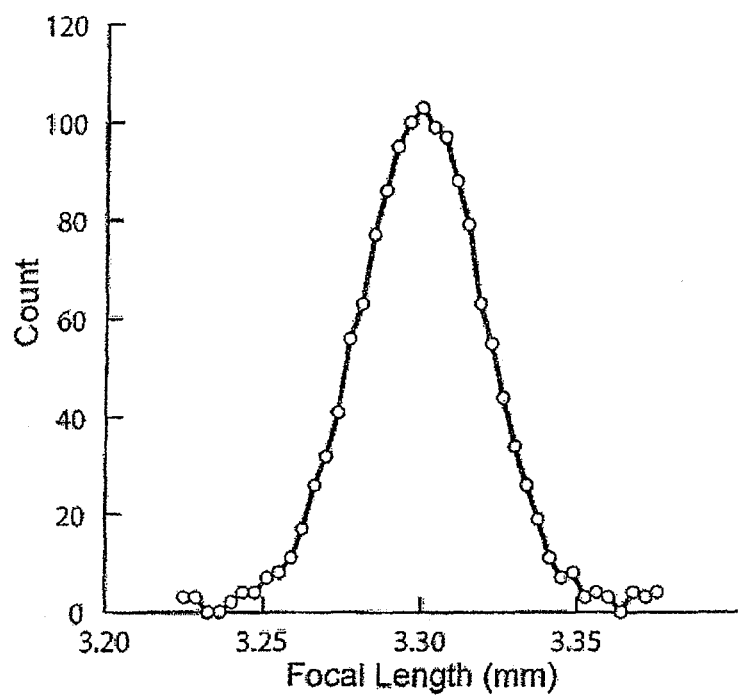
FIG. 2 illustrates an exemplary distribution of focal lengths of optical elements created from common wafer(s).

A potential solution for minimizing focal length variation between optical elements created from common wafer(s) is to measure the optical properties of all or substantially all of the optical elements prior to singulation. A distribution of the necessary height compensation can be generated from the measured optical properties, and the height of a spacer wafer (114) can be chosen such that the center of the distribution is placed in focus at the image sensor. FIG. 2 illustrates an exemplary distribution of focal lengths of optical elements created from common wafer(s).

The foregoing solution, however, still leads to inefficiencies as the spacer wafer will fail to provide an optimal focus compensation for optical elements outside the center of the distribution. As a result, optical imaging apparatus comprising optical elements falling outside the center distribution may suffer from poor quality making the imaging apparatus unsuitable for a desired application or necessitating discardment.

In contrast to the situation demonstrated in FIGS. 1 and 2, the present invention provides optical imaging apparatus comprising at least one wafer level optical element, a spacer coupled to the wafer level optical element and a plurality of focus compensation standoffs on the spacer, the standoffs defining an electro-optical element or wafer level optical element mounting surface having a surface roughness different from at least one other surface roughness of the spacer. In some embodiments, the height of the plurality of focus compensation standoffs is tailored to set the wafer level optical element(s) of the optical imaging apparatus at the desired distance from the image plane such that the focal point of the optical element(s) is at or near the image plane. In some embodiments, the image plane of an optical imaging apparatus coincides with the plane of the electro-optical element.

As described herein, in some embodiments, an electro-optical element or wafer level optical element mounting surface of a focus compensation standoff has a surface roughness different from at least one other surface roughness of the spacer. In some embodiments, the surface roughness of an electro-optical element or wafer level optical element mounting surface of a focus compensation standoff is less than a surface roughness of at least one other surface of the spacer. In another embodiment, the surface roughness of an electro-optical element or wafer level optical element mounting surface of a focus compensation standoff is greater than a surface roughness of at least one other surface of the spacer. The difference in surface roughness, in some embodiments, may be attributed to the particular process used to adjust the height of the focus compensation standoff including, but not limited to, cutting, polishing ablating or otherwise trimming.

In some embodiments, the average areal surface roughness ($S_a$) of an electro-optical element or wafer level optical element mounting surface of a focus compensation standoff is less than about 1 µm. In some embodiments, for example, the $S_a$ of an electro-optical element or wafer level optical element mounting surface of a focus compensation standoff ranges from about 0.1 µm to about 0.6 µm. In another embodiment, the $S_a$ of an electro-optical element or wafer level optical element mounting surface of a focus compensation standoff is greater than about 1 µm.

Moreover, in some embodiments, the areal root mean square surface (rms) roughness ($S_q$) of an electro-optical element or wafer level optical element mounting surface of a focus compensation standoff is less than about 1 µm. In one embodiment, for example, the $S_q$ of an electro-optical element or wafer level optical element mounting surface of a focus compensation standoff ranges from about 0.1 µm to about 0.8 µm. The $S_q$ of an electro-optical element or wafer level optical element mounting surface of a focus compensation standoff, in another embodiment, ranges from about 0.2 µm to about 0.7 µm. In some embodiments, the $S_q$ of an electro-optical element or wafer level optical element mounting surface of a focus compensation standoff is greater than about 1 µm.

As known to one of skill in the art, $S_a$ and $S_q$ can be measured according to several techniques and instruments. $S_a$ and $S_q$ values described herein were measured with a Vecco Confocal Metrology (VCM)-200 Advanced Confocal Profiling System commercially available from Vecco Instruments, Inc. of Plainview, N.Y.

In some embodiments, the $S_a$ and/or $S_q$ of an electro-optical element or wafer level optical element mounting surface of a focus compensation standoff differs from the $S_a$ and/or $S_q$ of at least one other surface of the spacer by at least about 5%. In some embodiments, the $S_a$ and/or $S_q$ of an electro-optical element or wafer level optical element mounting surface of a focus compensation standoff differs from the $S_a$ and/or $S_q$ of at least one other surface of the spacer by at least about 10% or at least about 30%. In other embodiments, the $S_a$ and/or $S_q$ of an electro-optical element or wafer level optical element mounting surface of a focus compensation standoff differs from the $S_a$ and/or $S_q$ of at least one other surface of the spacer by at least about 50% or at least about 100%.

Figure 13:
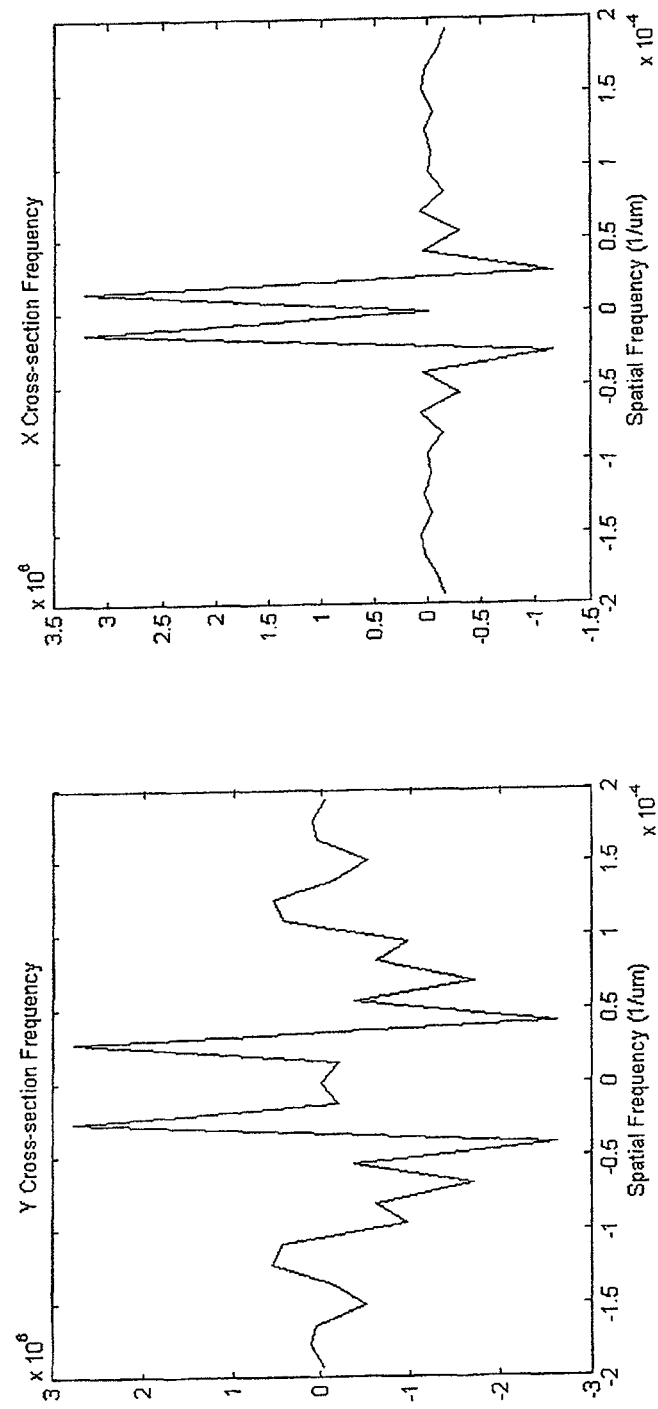
FIG. 13 illustrates the surface roughness frequencies in the x and y directions for an electro-optical element or wafer level optical element mounting surface according to one embodiment of the present invention.

Additionally, in some embodiments, the surface roughness of an electro-optical element or wafer level optical element mounting surface of a focus compensation standoff is different in a first direction of the mounting surface in comparison with a second direction of the mounting surface. In one embodiment, for example, the surface roughness of an electro-optical element or wafer level optical element mounting surface is different in the x-direction in comparison with the y-direction. In some embodiments, differences in surface roughness in varying directions of an electro-optical element or wafer level optical element mounting surface comprises differences in frequency content. FIG. 13 illustrates the surface roughness frequencies in the x and y directions for an electro-optical element or wafer level optical element mounting surface according to one embodiment of the present invention. As illustrated in FIG. 13, the surface roughness frequency content in the y-direction differs from the surface roughness frequency content in the x-direction. The directional difference in surface roughness, in some embodiments, may be attributed to the particular process used to adjust the height of the focus compensation standoff including, but not limited to, cutting, polishing ablating or otherwise trimming.

In some embodiments, focus compensation standoffs on the spacer of an optical imaging apparatus can have the same or substantially the same heights. In other embodiments, focus compensation standoffs of an optical imaging apparatus can have different heights. In some embodiments, wherein the focus compensation standoffs on a spacer of an optical imaging apparatus have different heights, the focus compensation standoffs can assist in correcting tilt in the wafer level optical element(s).

Figure 3:
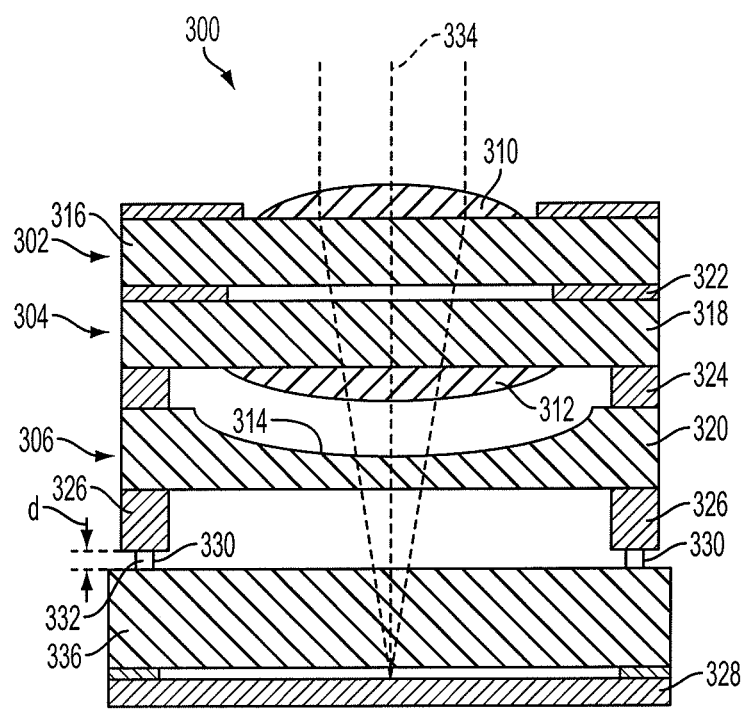
FIG. 3 illustrates an optical imaging apparatus according to one embodiment of the present invention.

FIG. 3 illustrates an optical imaging apparatus according to one embodiment of the present invention. The optical imaging apparatus (300) illustrated in FIG. 3 comprises a plurality of wafer level optical elements (302, 304, 306) arranged as a lens stack and an electro-optical element (328). The wafer level optical elements (302, 304, 306) comprise optical surfaces (310, 312, 314) operable for interacting with electromagnetic radiation. In some embodiments, the optical surfaces (310, 312, 314) refract or diffract electromagnetic radiation. Optical surfaces (310, 312, 314) may be formed on substrates (316, 318, 320) using known techniques including, but not limited to, lithographic and replication processes. In some embodiments, optical surfaces comprise glass and/or polymeric materials.

In some embodiments, an optical surface is convex or concave. Moreover, in some embodiments, each substrate (316, 318, 320) may have two or more optical surfaces formed thereon working in conjunction to provide biconvex, biconcave or concave/convex arrangements. Optical surfaces (310, 312, 314) may be spherical or aspherical in shape as appropriate for a given design.

The substrates of wafer level optical elements (302, 304, 306), in some embodiments, are separated by spacers (322, 324). In other embodiments, wafer level optical elements (302, 304, 306) are bonded directly to one another.

In the embodiment illustrated in FIG. 3, a spacer (326) is coupled to the wafer level optical element (306) closest to the electro-optical element (328). As provided herein, the spacer comprises a plurality of focus compensation standoffs (330) defining mounting surfaces (332) for the electro-optical element (328). The focus compensation standoffs (330) have a height or distance (d) to set the focal point of the wafer level optical element stack at or near the plane of the electro-optical element (328). An exemplary beam of light (334) passing through the wafer level optical element stack is focused at or near the plane of the electro-optical element (328).

In some embodiments, a cover-glass is disposed between the wafer-level optical element(s) and the electro-optical element. In some embodiments, wherein a cover glass is disposed between the wafer-level optical element(s) and the electro-optical element, the height of the cover glass and the measured optical properties of the wafer-level optical element(s) are used to determine an appropriate height of the focus compensation standoffs to set the focal point of the wafer level optical element(s) at or near a desired image plane, such as the plane of the electro-optical element.

The optical imaging apparatus (300) illustrated in FIG. 3 comprises a cover glass (336) disposed between the wafer level optical element stack and the electro-optical element (328). The plurality of focus compensation standoffs (330) are coupled to the cover glass (336) at mounting surfaces (332). In some embodiments wherein a cover glass (336) is not present, the plurality focus compensation standoffs (330) are coupled to the electro-optical element (328) at mounting surfaces (332). Moreover, in some embodiments, the plurality of focus compensation standoffs are coupled to another spacer wafer.

Figure 12:
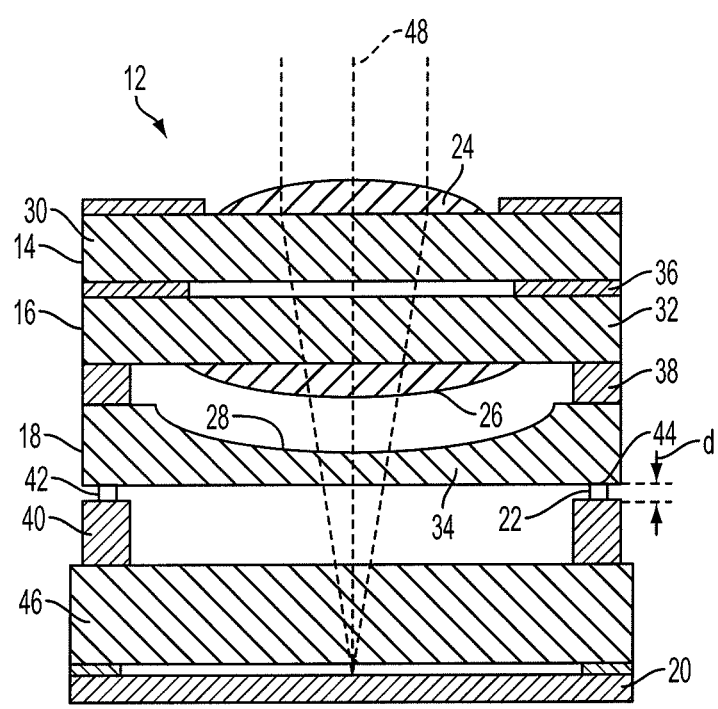
FIG. 12 illustrates an optical imaging apparatus according to one embodiment of the present invention.

As provided herein, in some embodiments, the mounting surfaces of focus compensation standoffs receive a wafer level optical element. FIG. 12 illustrates an optical imaging apparatus according to one embodiment of the present invention, wherein focus compensation standoff mounting surfaces are coupled to a wafer level optical element. The optical imaging apparatus (12) illustrated in FIG. 12, comprises a plurality of wafer level optical elements (14, 16, 18) arranged as a lens stack and an electro-optical element (20). The wafer level optical elements (14, 16, 18) comprise optical surfaces (24, 26, 28) operable for interacting with electromagnetic radiation. In some embodiments, optical surfaces (24, 26, 28) refract or diffract electromagnetic radiation. Optical surfaces (24, 26, 28) may be formed on substrates (30, 32, 34) using known techniques including, but not limited to, lithographic and/or replication processes. In some embodiments, optical surfaces comprise glass and/or polymeric materials.

In some embodiments, an optical surface is convex or concave. Moreover, in some embodiments, each substrate (30, 32, 34) may have two or more optical surfaces formed thereon working in conjunction to provide biconvex, biconcave or concave/convex arrangements. Optical surfaces (24, 26, 28) may be spherical or aspherical in shape as appropriate for a given design.

The substrates of wafer level optical elements (14, 16, 18), in some embodiments, are separated by spacers (36, 38). In other embodiments, wafer level optical elements (14, 16, 18) are bonded directly to one another.

In the embodiment illustrated in FIG. 12, a spacer (40) is coupled to the coverglass (46) of the electro-optical element (20). The spacer (40) comprises a plurality of focus compensation standoffs (42) defining mounting surfaces (44). The focus compensation standoffs (42) have a height or distance (d) to set the focal point of the wafer level optical element stack at or near the plane of the electro-optical element (20). The mounting surfaces (44) of the focus compensation standoffs are coupled to wafer level optical element (18) of the optical element stack. An exemplary beam of light (48) passing through the wafer level optical element stack is focused at or near the plane of the electro-optical element (20).

In some embodiments, focus compensation standoffs of optical imaging apparatus are bonded to the spacer. In other embodiments, focus compensation standoffs are continuous with the spacer or form a monolithic structure with the spacer. As described further herein, in some embodiments, wherein the focus compensation standoffs are continuous with or form a monolithic structure with the spacer, the focus compensation standoffs have been formed by shaping, molding or cutting the spacer.

Figure 4:
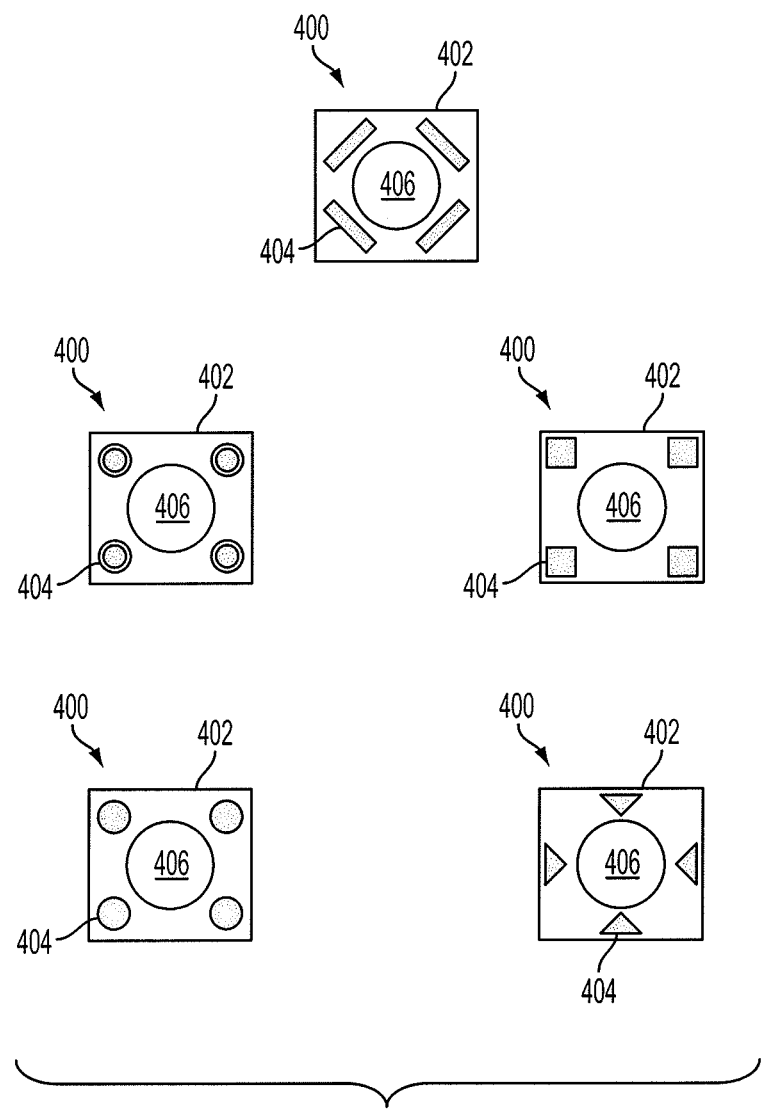
FIG. 4 illustrates various shapes of standoffs according to some embodiments of the present invention.

Moreover, focus compensation standoffs can have any desired shape. In some embodiments, a focus compensation standoff has a polygonal shape including, but not limited to a triangle, square or rectangle. In other embodiments, a focus compensation standoff has a circular, elliptical or conical shape. FIG. 4 illustrates a bottom plan view of optical dies comprising a spacer having focus compensation standoffs of various shapes according to some embodiments of the present invention. As illustrated in FIG. 4, the optical dies (400) comprise a spacer (402) and a plurality of focus compensation standoffs (404) coupled to the spacer. As provided herein, in some embodiments, the plurality of focus compensation standoffs (404) are bonded to the spacer (402). In other embodiments, the plurality of focus compensation standoffs (404) are continuous with the spacer (402). The spacer (402) also comprises an aperture (406) for passing electromagnetic radiation to or from the wafer level optical element(s) coupled to the spacer as described herein.

The plurality of focus compensation standoffs can have any desired arrangement on the spacer. In some embodiments, the arrangement of focus compensation standoffs has at least one plane of symmetry. In other embodiments, the arrangement of focus compensation standoffs is asymmetrical. In another embodiment, focus compensation standoffs are arranged at the periphery of the spacer. In some embodiments, focus compensation standoffs are arranged inward away from the periphery of the spacer towards the aperture of the spacer. In some embodiments, focus compensation standoffs are arranged adjacent the aperture of a spacer. Moreover, in some embodiments, different numbers of standoffs (404) may be used per die location. Where FIG. 4 illustrates four standoffs (404) for each die, fewer or more standoffs can be provided at each die location.

As described herein, optical imaging apparatus, in some embodiments, further comprise an electro-optical element. In some embodiments, an electro-optical element comprises an electromagnetic radiation sensing element. An electromagnetic radiation sensing element, in some embodiments, comprises a photosensitive region operable to detect electromagnetic radiation received by the optical imaging apparatus.

In some embodiments, the sensing element, including the photosensitive region, comprises a semiconductor. Any suitable semiconductor not inconsistent with the objectives of the present invention can be used for the sensing element, including the photosensitive region. In some embodiments, a semiconductor comprises a Group IV semiconductor, including silicon or any combination of Group IV elements. In another embodiment, a semiconductor comprises a Group III/V semiconductor or a Group II/VI semiconductor.

In some embodiments, the photosensitive region of a sensing element comprises a focal plane array. A focal plane array, in some embodiments, is a VGA sensor, comprising 640×480 pixels. In some embodiments, the sensor includes fewer pixels (e.g., CIF, QCIF), or more pixels (1 or more megapixel).

In one embodiment, a sensing element including the photosensitive region comprises a charge coupled device (CCD). In another embodiment, a sensing element including the photosensitive region comprises a complimentary metal oxide semiconductor (CMOS) architecture.

In some embodiments, an electro-optical element generates electromagnetic radiation to be provided by the optical imaging apparatus. Any desired element for generating electro-magnetic radiation not inconsistent with the objectives of the present invention can be used. In some embodiments an electro-optical element generating electromagnetic radiation comprises one or more light emitting diodes (LED). In some embodiments, a LED comprises inorganic materials such as inorganic semiconductors. In other embodiments, a LED comprises organic materials such as organic semiconductors including polymeric semiconductors. In a further embodiment, a LED comprises a mixture of organic and inorganic materials.

As optical imaging apparatus described herein, in some embodiments, can be constructed at the wafer level, the present invention, in another aspect, also provides a wafer comprising a first aperture and a plurality of first focus compensation standoffs corresponding to a first optical element location on an optical wafer and a second aperture and a plurality of second focus compensation standoffs corresponding to a second optical element location on the optical wafer. In some embodiments, the height of the plurality of first focus compensation standoffs is different from the height of the second focus compensation standoffs. In other embodiments, the height of the plurality of first focus compensation standoffs is the same or substantially the same as the height of the plurality of second focus compensation standoffs.

The wafer can be coupled to the optical wafer comprising the first and second optical elements. When coupled to the optical wafer, the first and second apertures achieve the desired alignment with the first and second optical elements of the optical wafer respectively. Moreover, the plurality of first focus compensation standoffs sets the first optical element the desired distance or height from a first image plane such that the focal point of the first optical element is at or near the first image plane. Similarly, the plurality of second focus compensation standoffs sets the second optical element the desired distance or height from a second image plane such that the focal point of the second optical element is at or near the image plane.

As provided herein, the height of the first focus compensation standoffs is determined according to the focal length and/or other optical properties of the first optical element and the presence of any cover glass if the first optical element is to be associated with an electro-optical element having a cover glass. Additionally, the height of the second focus compensation standoffs is determined according to the focal length and/or optical properties of the second optical element and the presence of any cover glass if the second optical element is to be associated with an electro-optical element having a cover glass.

Figure 5:
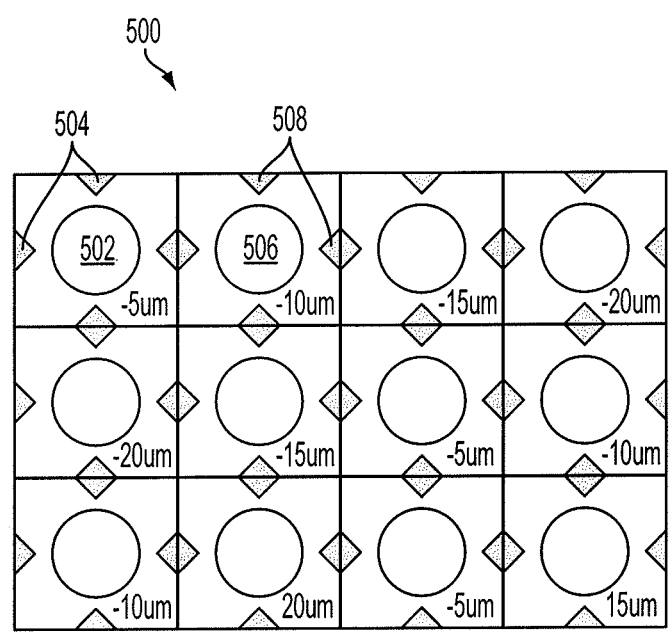
FIG. 5 illustrates a spacer wafer comprising a plurality of apertures and a plurality of focus compensation standoffs according to one embodiment of the present invention.

FIG. 5 illustrates a wafer (500) comprising a first aperture (502) and a plurality of first focus compensation standoffs (504) corresponding to a first optical element location on an optical wafer and a second aperture (506) and a plurality of second focus compensation standoffs (508) corresponding to a second optical element location on the optical wafer. As the optical properties of the first optical element and the second optical element are different due to manufacturing variations within the optical wafer, the plurality of first focus compensation standoffs (504) is set to a height different from the height of the plurality of second focus compensation standoffs (508). In the embodiment illustrated in FIG. 5, the difference in height between the plurality of first focus compensation standoffs (504) and the plurality of second focus compensation standoffs (508) is 5 μm.

In addition to the first and second apertures, the wafer (500) comprises several more apertures and focus compensation standoffs wherein each aperture and associated focus compensation standoffs correspond to an individual optical element location on the optical wafer comprising the first and second optical elements.

As illustrated in FIG. 5, the standoffs (504, 508, etc.) are disposed along dicing lanes of individual optical dies. In this configuration, the standoffs (504, 508, etc.) of adjacent dies are continuous with one another until separated during singulation of the adjacent dies.

Figure 9:
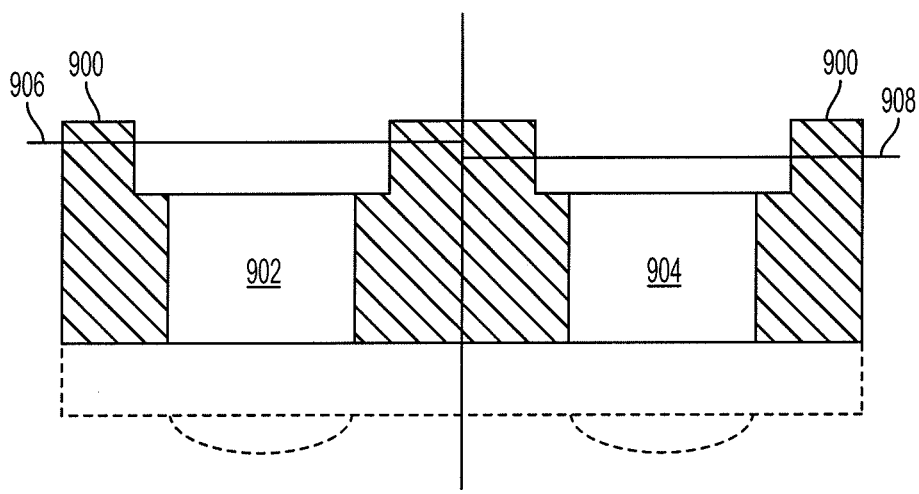
FIG. 9 illustrates a spacer wafer at adjacent die locations according to one embodiment of the present invention.

FIG. 9 illustrates a spacer wafer at adjacent die locations according to one embodiment of the present invention. As focus compensation standoffs have not been provided to the spacer wafer (900), the height of the spacer wafer (900) at the first die location (902) and the second die location (904) is the same or substantially the same. As illustrated in FIG. 9, focus compensation standoffs are to be provided to the spacer wafer (900) at a first height (906) for the first die location (902) and a second height (908) for the second die location (904), wherein the first height (906) and the second height (908) are not equal. As described herein, the focus compensation standoffs can be provided by a variety of methods including, but not limited to, dicing, laser ablation, polishing, replicating, etc.

Figure 10:
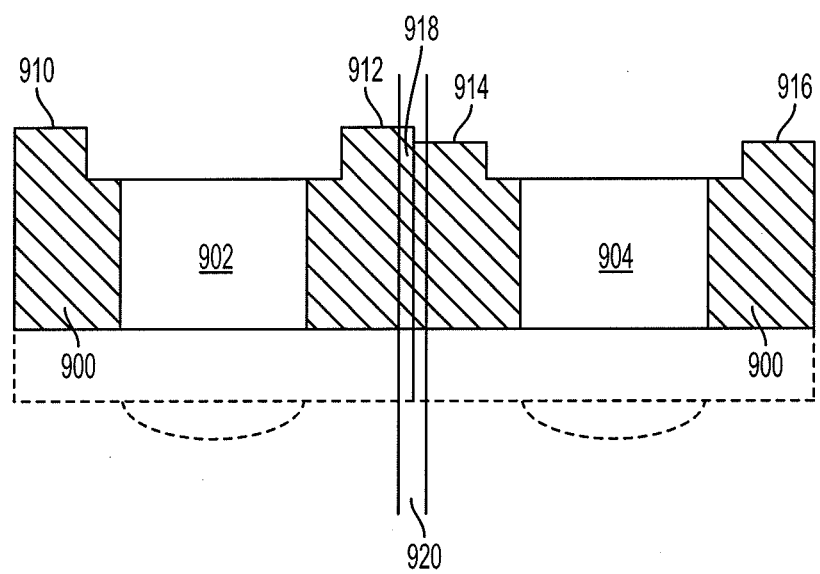
FIG. 10 illustrates a spacer wafer at adjacent die locations comprising focus compensation standoffs according to one embodiment of the present invention.

FIG. 10 illustrates the spacer wafer of FIG. 9 wherein focus compensation standoffs have been provided to the spacer wafer. The focus compensation standoffs (910, 912) at the first die location (902) have a different height than the focus compensation standoffs (914, 916) at the second (904) die location. Moreover, the focus compensation standoffs (912, 914) are continuous with one another. In some embodiments, residual material (918) is left over from the process used to create the focus compensation standoffs. The blade width (920) of the apparatus used to singulate the optical dies (902, 904), however, is sufficiently wide to remove any residual material (918).

Figure 11:
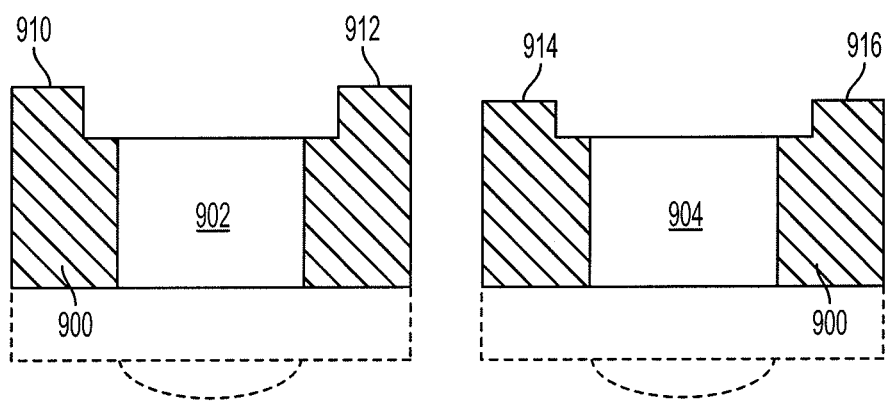
FIG. 11 illustrates singulated optical dies comprising a spacer wafer having focus compensation standoffs according to one embodiment of the present invention.

FIG. 11 illustrates the singulated optical dies (902, 904) comprising the spacer (900) with focus compensation standoffs (910, 912, 914, 916) according to one embodiment of the present invention.

In some embodiments, the focal length and/or other optical properties of each optical element of an optical wafer can be determined and the focus compensation of each optical element calculated. The focus compensation for each optical element can be mapped to a wafer as illustrated in FIG. 5 such that the height of the standoffs at each wafer position can be adjusted to provide the desired focus composition for the corresponding optical element of the optical wafer.

In another aspect, the present invention provides a wafer assembly comprising an optical wafer and a second wafer coupled to the optical wafer, the optical wafer comprising an array of optical elements. A first optical die is located at a first die location on the wafer assembly and comprises a first optical element on the optical wafer and first focus compensation standoffs on the second wafer. A second optical die is located at a second die location on the optical wafer and comprises a second optical element on the optical wafer and second focus compensation standoffs on the second wafer, wherein the height of the second focus compensation standoff is different from the height of the first focus compensation standoffs.

As described herein, the height of the plurality of first focus compensation standoffs, in some embodiments, can be determined according to the focal length and/or optical properties of the first optical element and the presence of a cover glass if the first optical die is to be coupled with an electro-optical element having a cover glass. Similarly, the height of the plurality of second focus compensation standoffs, in some embodiments, can be determined according to the focal length and/or other optical properties of the second optical element and the presence of a cover glass if the second optical die is to be coupled with an electro-optical element having a cover glass.

As the optical properties of the first optical element and the second optical element are different due to manufacturing variations within the optical wafer, the plurality of first focus compensation standoffs is set to a height different from the height of the plurality of second focus compensation standoffs.

In another aspect, the present invention also provides a wafer comprising a plurality of singulated wafer level optical die assemblies. In one embodiment, a wafer comprises a first singulated optical die assembly comprising a first optical element, a first spacer and first focus compensation standoffs and a second singulated optical die assembly comprising a second optical element, a second spacer and second focus compensation standoffs. In some embodiments, the first and second focus compensation standoffs have unequal heights.

Additionally, in some embodiments, the heights of the first and second focus compensation standoffs take into consideration the height of the wafer to which the first and second optical die assemblies are coupled.

In some embodiments, the wafer comprising the first and second singulated optical die assemblies is coupled to a wafer comprising a first and second electro-optical elements. In some embodiments, coupling a wafer comprising the singulated first and second optical die assemblies to the wafer comprising first and second electro-optical elements can achieve the desired alignment between the first singulated optical die assembly and the first electro-optical element and the desired alignment between the second singulated optical die assembly and the second electro-optical element. In some embodiments, the wafer comprising the first and second optical assembly dies and the wafer comprising the first and second electro-optical elements can be singulated subsequent to coupling to provide a first singulated optical imaging apparatus comprising the first optical die and the first electro-optical element and a second optical imaging apparatus comprising the second singulated optical die and the second electro-optical element.

Figure 6:
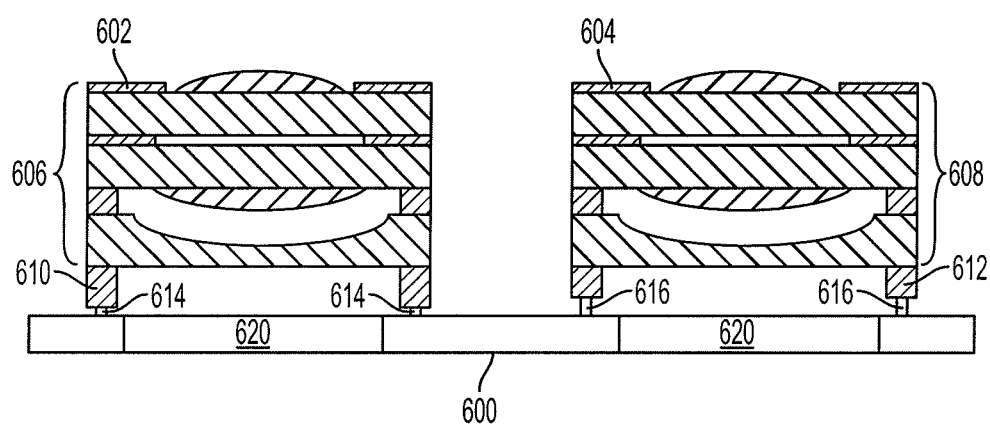
FIG. 6 illustrates a singulated optical dies coupled to a wafer according to one embodiment of the present invention.

FIG. 6 illustrates a wafer (600) comprising a first singulated optical die assembly (602) and a second singulated optical die assembly (604) according to one embodiment of the present invention. The singulated first (602) and second (604) optical die assemblies in the embodiment illustrated in FIG. 6 each comprise an optical element stack (606, 608) comprising a plurality of wafer level optical elements. A spacer (610) is coupled to the optical element stack (606) of the first optical die assembly (602), and a spacer (612) is coupled to the optical element stack (608) of the second optical die assembly (604).

Spacer (610) comprises a plurality of first focus compensation standoffs (614) of an appropriate height to set the optical elements of the first optical die (602) a desired distance from first image plane such that the focal point of the optical elements is located at or near first image plane. Similarly, spacer (612) comprises a plurality of second focus compensation standoffs (616) of an appropriate height to set the optical elements of the second optical die (604) a desired distance from a second image plane such that the focal point of the optical elements is located at or near second image plane. As provided herein, in some embodiments, the heights of the first and second focus compensation standoffs (614, 616) take into consideration the height of the wafer (600) to which the first (602) and second (604) optical die assemblies are coupled.

As the optical elements of the first (602) and second (604) optical die assemblies have different optical properties due to manufacturing variations within the optical wafer or batches of optical wafers used to produce the wafer level optical elements of the respective optical stacks (606, 608), the first focus compensation standoffs (614) have a different height than the second focus compensation standoffs (616).

In some embodiments, wafer (600) comprises apertures (620) aligned with optical element stacks (606, 608) to permit radiation to pass though the wafer in a desired manner. In one or more embodiments, the aperture (620) may function as a stop.

In another aspect, the present invention provides methods of producing optical imaging apparatus. As described further herein, methods of the present invention, in some embodiments, can overcome one or more inefficiencies of prior optical element focusing techniques wherein focal adjustments are made after assembly of the optical element into a turret or barrel.

Figure 7:
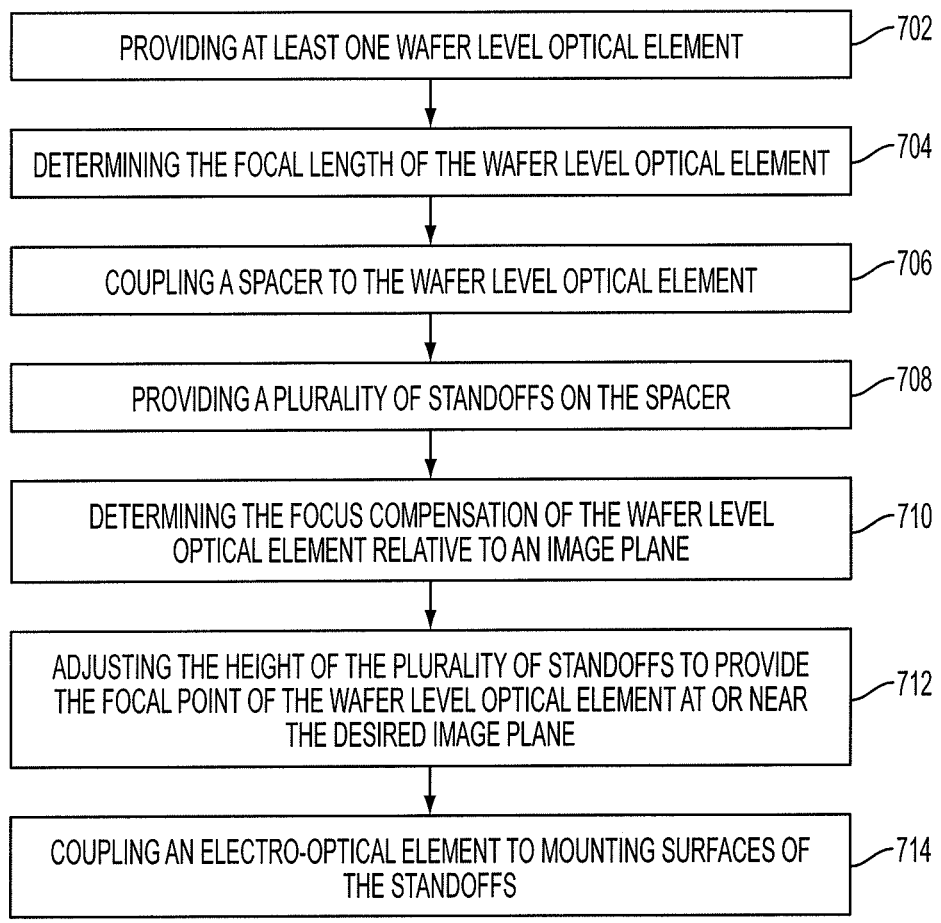
FIG. 7 is a flowchart outlining a method of producing an optical imaging apparatus according to one embodiment of the present application

FIG. 7 provides a flow chart outlining a method of producing an optical imaging apparatus according to one embodiment of the present invention. At least one wafer level optical element is provided (702) and the focal length of the wafer level optical element is measured or theoretically determined (704). Wafer level optical elements, in some embodiments, can be provided by forming optical surfaces on a wafer substrate by deposition of glass and/or polymeric materials or by etching or ablating the surface of a substrate.

Additionally, as described herein, in some embodiments, a plurality of wafer level optical elements are provided as an optical element stack. In such embodiments, the focal length of the optical element stack is measured or theoretically determined.

A spacer is coupled to the wafer level optical element or the optical element stack (706). A plurality of standoffs is provided on the spacer (708). In some embodiments, the plurality of standoffs are bonded to the spacer. In other embodiments, the plurality of standoffs are continuous with the spacer or form a monolithic structure with the spacer.

In some embodiments wherein the standoffs are continuous with the spacer or form a monolithic structure with the spacer, the standoffs are created by processes including, but not limited to, dicing, machining, etching, cutting, or lithographically ablating the spacer. In other embodiments wherein the standoffs are continuous with the spacer or form a monolithic structure with the spacer, the standoffs are formed at the time of molding the spacer. In one embodiment, for example, a mold having a shape accounting for the plurality of standoffs is provided, and the standoffs are co-molded with the spacer.

Alternatively, in some embodiments wherein the standoffs are bonded to the spacer, the standoffs can be deposited by replication techniques or bonded to the spacer by an adhesive. In some embodiments, for example, standoffs can be provided on the spacer corresponding to one or more die locations by step and repeat replication techniques.

The focus compensation of the wafer level optical element or optical element stack relative to an image plane is calculated or determined (710). As described herein the focus compensation of a wafer level optical element can be calculated according to the focal length of the optical element and the dimensions of any structures disposed between the wafer level optical element and the image plane, such as a cover glass, other spacers, or a lens holder.

The height of the plurality of standoffs is adjusted to provide the focal point of the wafer level optical element or optical element stack at or near the desired image plane (712). In some embodiments, the standoff height is adjusted by processes including, but not limited to, cutting, polishing or otherwise trimming the standoffs in the axial direction. In one embodiment, the standoff height is adjusted by the peripheral edge of a dicing saw. In one implementation, the standoff height is adjusted using the dicing saw used to singulate the individual die. In other embodiments, the standoff height can be adjusted by ablating the standoffs in the axial direction with a laser or other form of electromagnetic radiation.

In some embodiments, adjusting the height of a standoff provides the standoff an electro-optical element or wafer level optical element mounting surface having a surface roughness different from at least one other surface roughness of the spacer. In some embodiments, a surface roughness of an electro-optical element or wafer level optical element mounting surface of an adjusted standoff is less than at least one other surface roughness of the spacer. In other embodiments, a surface roughness of an electro-optical element or wafer level optical element mounting surface of an adjusted standoff is greater than at least one other surface roughness of the spacer. An electro-optical element or wafer level optical element mounting surface of an adjusted spacer, in some embodiments, can have any $S_a$ and/or $S_q$ value described herein.

As the height of a standoff is adjusted in the axial direction, a surface of the standoff having a surface roughness different from a surface roughness of the spacer, in some embodiments, is the surface to which an electro-optical element or cover glass is mounted or coupled.

In some embodiments, a method of producing an optical imaging apparatus further comprises coupling an electro-optical element to mounting surfaces of the standoffs (714). In some embodiments, the cover glass of an electro-optical element is coupled to the mounting surfaces of the standoffs. Moreover, in some embodiments, a surface of the electro-optical element coincides with the image plane of the wafer level optical element or optical element stack.

Figure 8A:
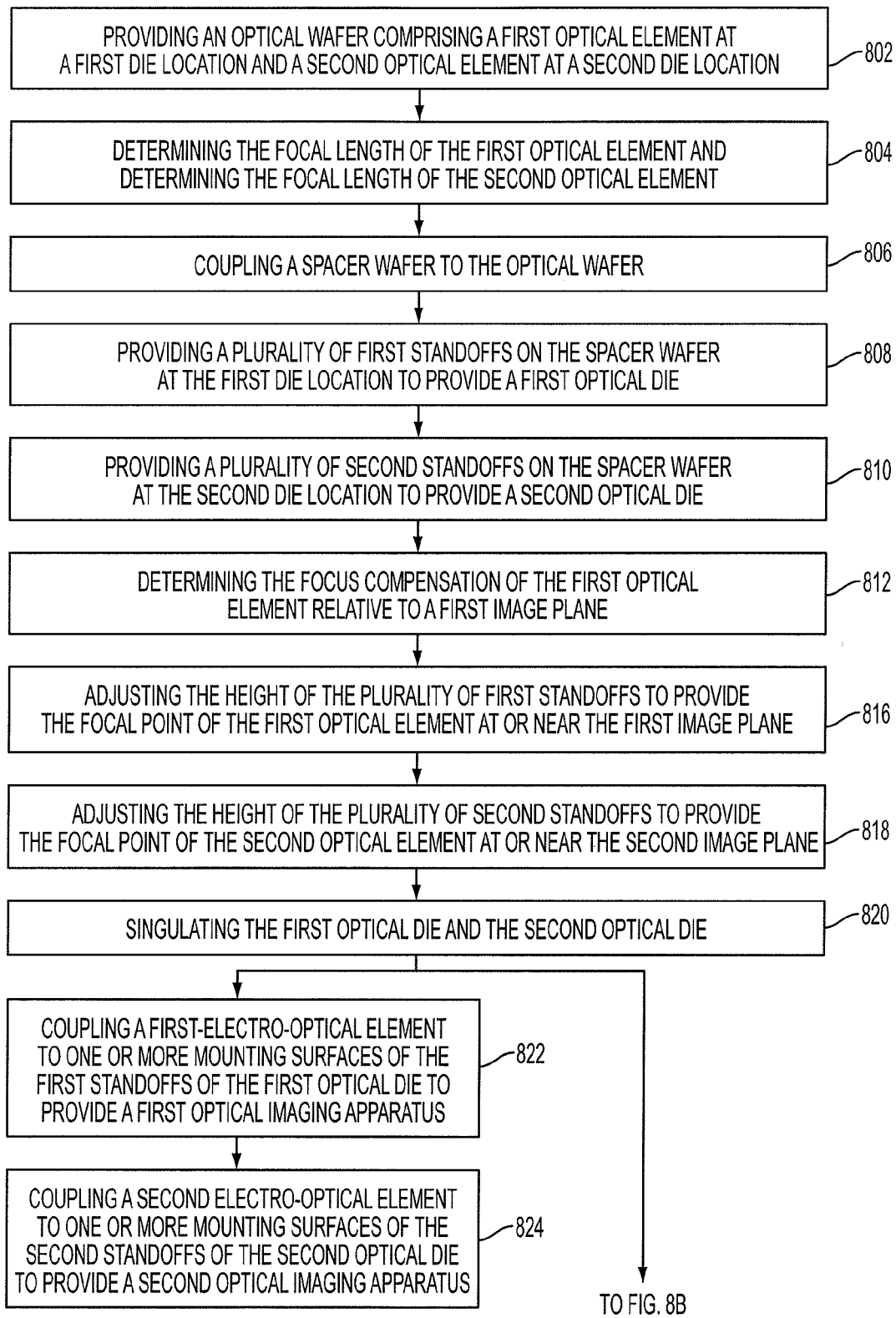
FIGS. 8A and 8B are a flowchart outlining a method of producing an optical imaging apparatus according to one embodiment of the present invention.
Figure 8B:
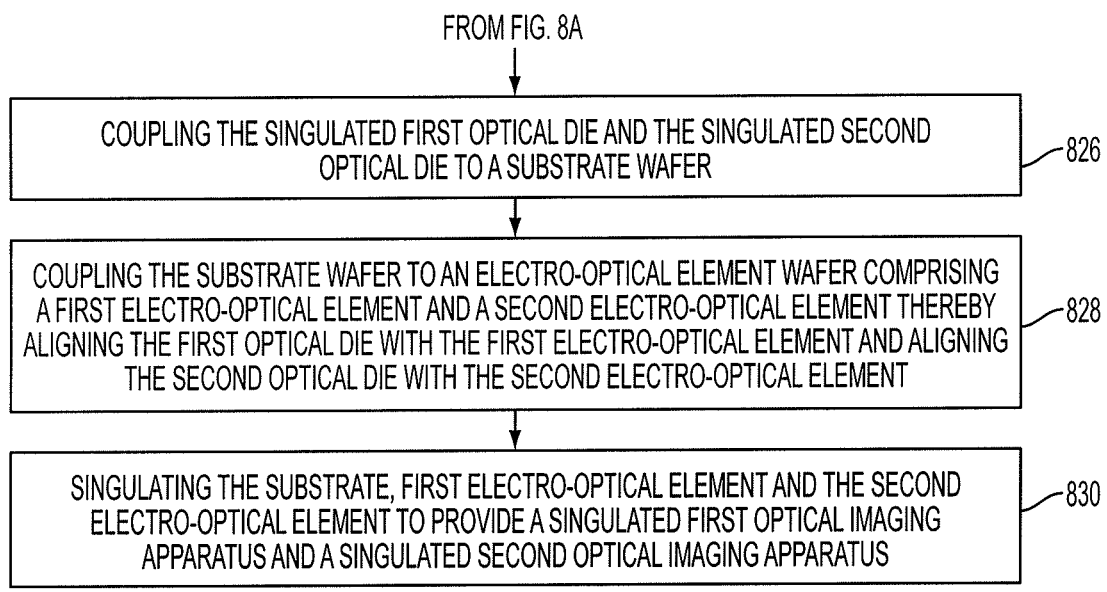

FIGS. 8A and 8B provide a flowchart outlining a method of producing optical imaging apparatus according to one embodiment of the present invention. An optical wafer comprising and first optical element at a first die location and a second optical element at a second die location is provided (802). The first and second optical elements can be provided by any of the techniques described herein or known in the art of wafer level optics. The focal length of the first optical element is determined, and the focal length of the second optical element is determined (804).

A spacer wafer is coupled to the optical wafer (806). A plurality of first standoffs is provided on the spacer wafer at the first die location to provide a first optical die (808). A plurality of second standoffs is provided on the spacer wafer at the second die location to provide a second optical die (810). The plurality of first standoffs and the plurality of second standoffs can be provided on the spacer wafer in any manner described herein including but not limited to dicing, machining, etching, cutting, lithographically ablating the spacer or step and repeat replication techniques. The focus compensation of the first optical element relative to a first image plane is calculated (812). The focus compensation for the second optical element relative to a second image plane is calculated (814).

The height of the plurality of first standoffs is adjusted to provide the focal point of the first optical element at or near the first image plane (816). The height of the plurality of second standoffs is adjusted to provide the focal point of the second optical element at or near second image plane (818). The heights of the first and second standoffs can be adjusted according to any of the methods described herein. Moreover, in some embodiments, adjusting the heights of the first and second standoffs provides the first and second standoffs with a surface roughness different from a surface roughness of the spacer.

In some embodiments, the first optical die and the second optical die are singulated (820). A first electro-optical element, in some embodiments, is coupled to one or more mounting surfaces of the first standoffs of the first singulated optical die to provide a first optical imaging apparatus (822). A second electro-optical element, in some embodiments, is coupled to one or more mounting surfaces of the second standoffs of the second singulated optical die to provide a second optical imaging apparatus (824).

In another embodiments, the singulated first optical die and the singulated second optical die are coupled to a substrate wafer (826). The substrate wafer is coupled to an electro-optical element wafer comprising a first electro-optical element and a second electro-optical element (828). Coupling the substrate to the electro-optical element wafer, in some embodiments, achieves the desired alignment between the first singulated optical die and the first electro-optical element and between the second optical die and the second electro-optical element. Moreover, in some embodiments, the first image plane coincides with a surface of the first electro-optical element, and the second image plane coincides with a surface of the second electro-optical element.

The substrate and the first and second electro-optical elements are singulated to provide a first singulated optical imaging apparatus and a second singulated optical imaging apparatus (830).

In another embodiment, a method of producing an optical imaging apparatus comprises providing at least one wafer level optical element, determining the focal length of the wafer level optical element, providing a spacer, providing a plurality of standoffs on the spacer, calculating the focus compensation for the optical element relative to an image plane, adjusting the height of the standoffs to provide the focal point of the wafer level optical element at or near the image plane and coupling wafer level optical element to mounting surfaces of the standoffs. In some embodiments, a method of producing an optical imaging apparatus further comprises coupling an electro-optical element to the spacer.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A wafer comprising:
   a first aperture;
   a plurality of first focus compensation standoffs of a first height, the first aperture and the first focus compensation standoffs corresponding to a first optical element location on an optical wafer and wherein the plurality of first focus compensation standoffs have a cylindrical, spherical, elliptical or conical shape;
   a second aperture; and
   a plurality of second focus compensation standoffs of a second height, the second aperture and the second focus compensation standoffs corresponding to a second optical element location on the optical wafer and wherein the plurality of second focus compensation standoffs have a cylindrical, spherical, elliptical or conical shape,
   wherein the first height and the second height are different.

2. The wafer of claim 1, wherein the plurality of first focus compensation standoffs and the plurality of second focus compensation standoffs are disposed substantially at the periphery of the respective first and second optical element locations.

3. The wafer of claim 2, wherein at least one of the first focus compensation standoffs is continuous with at least one of the second focus compensation standoffs at the junction between the first and second optical element locations.

4. The wafer of claim 1, wherein the plurality of first focus compensation standoffs and the plurality of second focus compensation standoffs are separate from each other and disposed inward away from the periphery of the respective first and second optical element locations and towards the respective first and second apertures.

5. The wafer of claim 1, wherein the plurality of first focus compensation standoffs and the plurality of second focus compensation standoffs comprise a symmetrical arrangement on the wafer.

6. The wafer of claim 1, wherein the plurality of first focus compensation standoffs and the plurality of second focus compensation standoffs comprise an asymmetrical arrangement on the wafer.

7. The wafer of claim 1, wherein the wafer is coupled to optical elements at the first optical element location and second optical element location.

8. The wafer of claim 7, wherein the first height and the second height comprise dimensions to set a focal point of the optical elements at or near an image plane.

9. The wafer of claim 1, wherein the plurality of first focus compensation standoffs and the plurality of second focus compensation standoffs comprise mounting surfaces configured to be coupled to cover glass, an electro-optical element, or a spacer.

10. A wafer assembly comprising:
    an optical wafer comprising an array of optical elements;
    a second wafer coupled to the optical wafer;
    a first optical die located at a first die location on the wafer assembly, the first optical die comprising a first optical element on the optical wafer and a plurality of first focus compensation standoffs on the second wafer; and
    a second optical die located at a second die location on the wafer assembly, the second optical die comprising a second optical element on the optical wafer and a plurality of second focus compensation standoffs on the second wafer,
    wherein the first focus compensation standoffs have a height different from the second focus compensation standoffs and
    wherein the plurality of first focus compensation standoffs and the plurality of second focus compensation standoffs are separate from each other and disposed inward away from the periphery of the respective first and second die locations.

11. The wafer assembly of claim 10, wherein the plurality of first focus compensation standoffs and the plurality of second focus compensation standoffs have a polygonal shape.

12. The wafer assembly of claim 10, wherein the plurality of first focus compensation standoffs and the plurality of second focus compensation standoffs have a cylindrical, spherical, elliptical or conical shape.

13. The wafer assembly of claim 10, wherein the first focus compensation standoffs and the second focus compensation standoffs comprise mounting surfaces for receiving an electro-optical element, a third wafer, or a second optical wafer.

14. The wafer assembly of claim 10, wherein the first height and the second height comprise dimensions to set a focal point of the optical elements at or near an image plane.

15. A wafer comprising:
    a first aperture;
    a plurality of first focus compensation standoffs of a first height, the first aperture and the first focus compensation standoffs corresponding to a first optical element location on an optical wafer;
    a second aperture; and
    a plurality of second focus compensation standoffs of a second height, the second aperture and the second focus compensation standoffs corresponding to a second optical element location on the optical wafer,
    wherein the first height and the second height are different and
    wherein the plurality of first focus compensation standoffs and the plurality of second focus compensation standoffs are separate from each other and disposed inward away from the periphery of the respective first and second optical element locations and towards the respective first and second apertures.

16. The wafer of claim 15, wherein the plurality of first focus compensation standoffs and the plurality of second focus compensation standoffs have a polygonal shape.

17. The wafer of claim 15, wherein the plurality of first focus compensation standoffs and the plurality of second focus compensation standoffs have a cylindrical, spherical, elliptical or conical shape.

18. The wafer of claim 15, wherein the plurality of first focus compensation standoffs and the plurality of second focus compensation standoffs comprise a symmetrical arrangement on the wafer.

19. The wafer of claim 15, wherein the plurality of first focus compensation standoffs and the plurality of second focus compensation standoffs comprise an asymmetrical arrangement on the wafer.

20. The wafer of claim 15, wherein the wafer is coupled to optical elements at the first optical element location and second optical element location.

21. The wafer of claim 20, wherein the first height and the second height comprise dimensions to set a focal point of the optical elements at or near an image plane.

22. The wafer of claim 15, wherein the plurality of first focus compensation standoffs and the plurality of second focus compensation standoffs comprise mounting surfaces configured to be coupled to cover glass, an electro-optical element, or a spacer.

23. A wafer assembly comprising:
an optical wafer comprising an array of optical elements;
a second wafer coupled to the optical wafer;
a first optical die located at a first die location on the wafer assembly, the first optical die comprising a first optical element on the optical wafer and a plurality of first focus compensation standoffs on the second wafer wherein the plurality of first focus compensation standoffs have a cylindrical, spherical, elliptical or conical shape; and
a second optical die located at a second die location on the wafer assembly, the second optical die comprising a second optical element on the optical wafer and a plurality of second focus compensation standoffs on the second wafer wherein the plurality of second focus compensation standoffs have a cylindrical, spherical, elliptical or conical shape,
wherein the first focus compensation standoffs have a height different from the second focus compensation standoffs.

24. The wafer assembly of claim 23, wherein the plurality of first focus compensation standoffs and the plurality of second focus compensation standoffs are disposed substantially at the periphery of the respective first and second die locations.

25. The wafer assembly of claim 24, wherein at least one of the first focus compensation standoffs is continuous with at least one of the second focus compensation standoffs at the junction between the first and second die locations.

26. The wafer assembly of claim 23, wherein the plurality of first focus compensation standoffs and the plurality of second focus compensation standoffs are separate from each other and disposed inward away from the periphery of the respective first and second die locations.

27. The wafer assembly of claim 23, wherein the first focus compensation standoffs and the second focus compensation standoffs comprise mounting surfaces for receiving an electro-optical element, a third wafer, or a second optical wafer.

28. The wafer assembly of claim 23, wherein the first height and the second height comprise dimensions to set a focal point of the optical elements at or near an image plane.

* * * * *